(12) United States Patent
Khorram (10) Patent No.: US 7,107,025 B2
(45) Date of Patent: Sep. 12, 2006

(54) HIGH GAIN, HIGHLY LINEAR MIXER

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 474 days.

(21) Appl. No.: 10/459,983

(22) Filed: Jun. 12, 2003

(65) Prior Publication Data

US 2004/0214533 A1 Oct. 28, 2004

Related U.S. Application Data

(60) Provisional application No. 60/465,425, filed on Apr. 25, 2003.

(51) Int. Cl.
*H04B 1/04* (2006.01)
*H01Q 11/12* (2006.01)

(52) U.S. Cl. ............ 455/118; 455/293; 455/319; 455/333; 455/334; 330/252; 330/253; 330/258; 330/275; 327/65; 327/66; 327/67; 327/359; 327/362

(58) Field of Classification Search ........... 455/293, 455/319, 333, 334, 118; 327/65, 66, 67, 327/51, 52, 55, 350, 359, 362; 330/252, 330/253, 258, 275
See application file for complete search history.

(56) References Cited

U.S. PATENT DOCUMENTS

| | | | | | |
|---|---|---|---|---|---|
| 6,037,825 | A | * | 3/2000 | Kung | 327/359 |
| 6,122,497 | A | * | 9/2000 | Gilbert | 455/333 |
| 6,542,019 | B1 | * | 4/2003 | Lim et al. | 327/359 |
| 2003/0236083 | A1 | * | 12/2003 | Wiklund et al. | 455/334 |

* cited by examiner

*Primary Examiner*—Nay Maung
*Assistant Examiner*—Tuan H. Nguyen
(74) *Attorney, Agent, or Firm*—Garlick Harrison & Markison; Timothy W. Markison (57) ABSTRACT

A high gain, highly linear mixer includes an input section, mixing section, at least one tuning component, and at least one stand by current source. The input section is operably coupled to receive an input voltage signal and perform a linear transconductance thereon to produce an input current signal. The mixing section is operably coupled to mix a local oscillation with the input current to produce a mixed current signal. The tuning component is operably coupled to the mixing section and to convert the mixed current signal into a mixed voltage signal that function as the output of the mixer. The standby current source is operably coupled to the mixing section and provides a standby current to the mixing section.

13 Claims, 6 Drawing Sheets

FIG. 6
mixer 100, 102, 106, 108, 112, and/or 114

FIG. 7
mixer 100, 102, 106, 108, 112, and/or 114

FIG. 8
mixer 100, 102, 106, 108, 112, and/or 114

HIGH GAIN, HIGHLY LINEAR MIXER

This invention is claiming priority under 35 USC § 119(e) to a provisionally filed patent application having the same title as the present patent application, a filing date of Apr. 25, 2003, and an application number of Ser. No. 60/465,425.

BACKGROUND OF THE INVENTION

1. Technical Field of the Invention

This invention relates generally to wireless communications and more particularly to a wireless communication device.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The intermediate frequency (IF) stages in the receiver and transmitter include mixers to mix the input signal with a local oscillation. For the IF stages in the receiver, the output of the mixers is provided to a poly-phased filter or a summing module and low pass filter to produce a down converted signal. For the IF stage in the transmitter, the output of the mixers is provided to a summing module and high-pass, or band-pass, filter to produce an up converted signal.

In either IF stage, the mixers must operate linearly over a relatively large frequency range and provide a modest level of gain. New standards (e.g. IEEE802.11g) are requiring the mixers to have greater gain. As is known, the gain of a mixer may be increased by increasing the operating current levels of the transistors within the mixer, however, this increases the mixer sensitive to the local oscillation. With increased sensitivity to the local oscillation, any imbalance in the local oscillation (e.g. the positive phase and negative phase do not have exactly the same amplitude) the linearity of the mixer decreases thereby increasing the phase error and decreasing image rejection, which is unacceptable for existing standards and well as for emerging standards.

Therefore, a need exists for a high gain, highly linear mixer.

BRIEF SUMMARY OF THE INVENTION

The high gain, highly linear mixer, the present invention, substantially meets these needs and others. In an embodiment, the high gain, highly linear mixer includes an input section, mixing section, at least one timing component, and at least one stand by current source. The input section is operably coupled to receive an input voltage signal and perform a linear transconductance thereon to produce an input current signal. The mixing section is operably coupled to mix a local oscillation with the input current to produce a mixed current signal. The tuning component is operably coupled to the mixing section and to convert the mixed current signal into a mixed voltage signal that function as the output of the high gain, highly linear mixer. The standby current source is operably coupled to the mixing section and provides a standby current to the mixing section such that the switching current of the mixing section is reduced, which improves gain of the mixer and improves the linearity of the mixer.

DETAILED DESCRIPTION OF THE INVENTION

Figure 1:
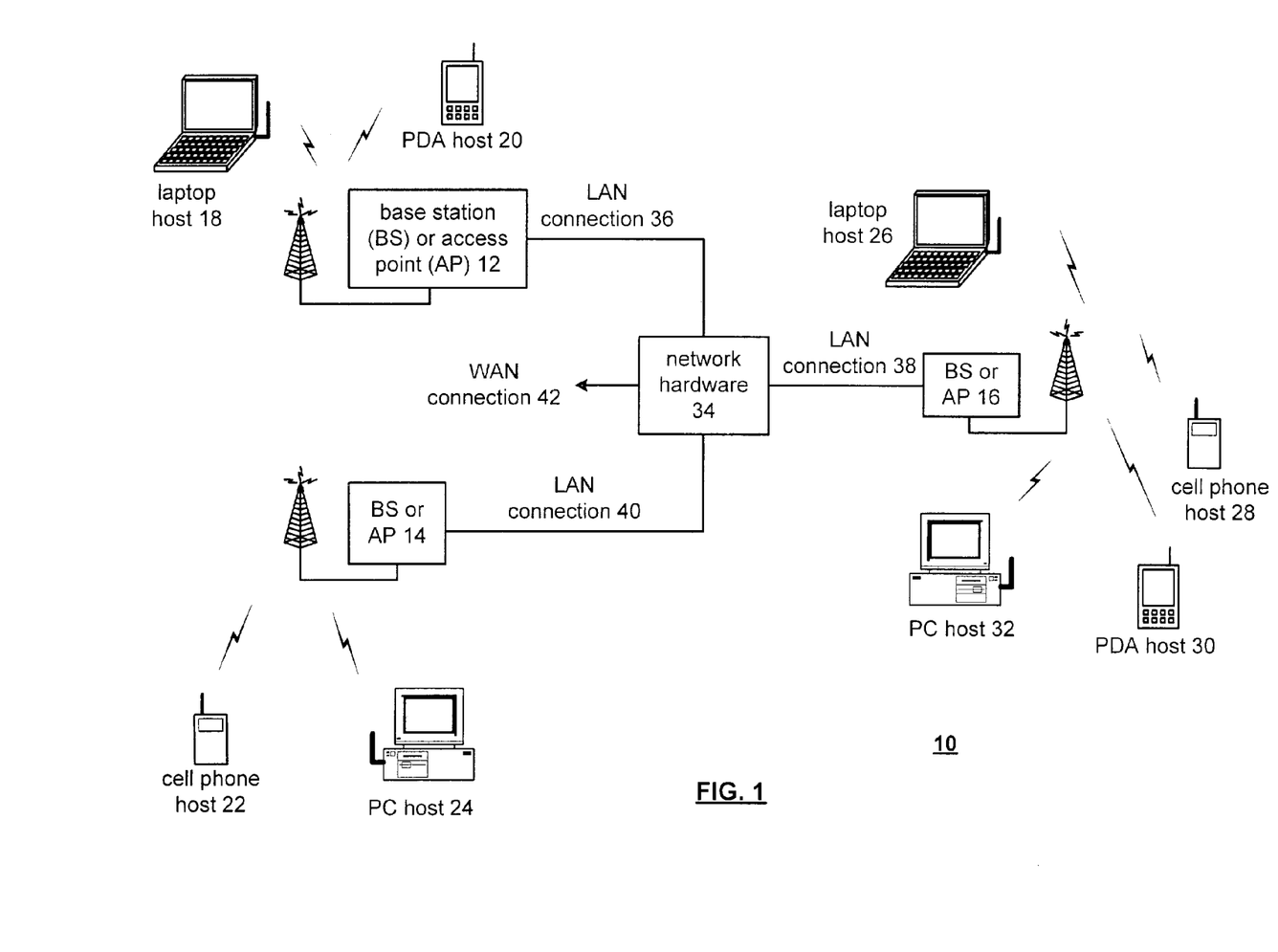
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
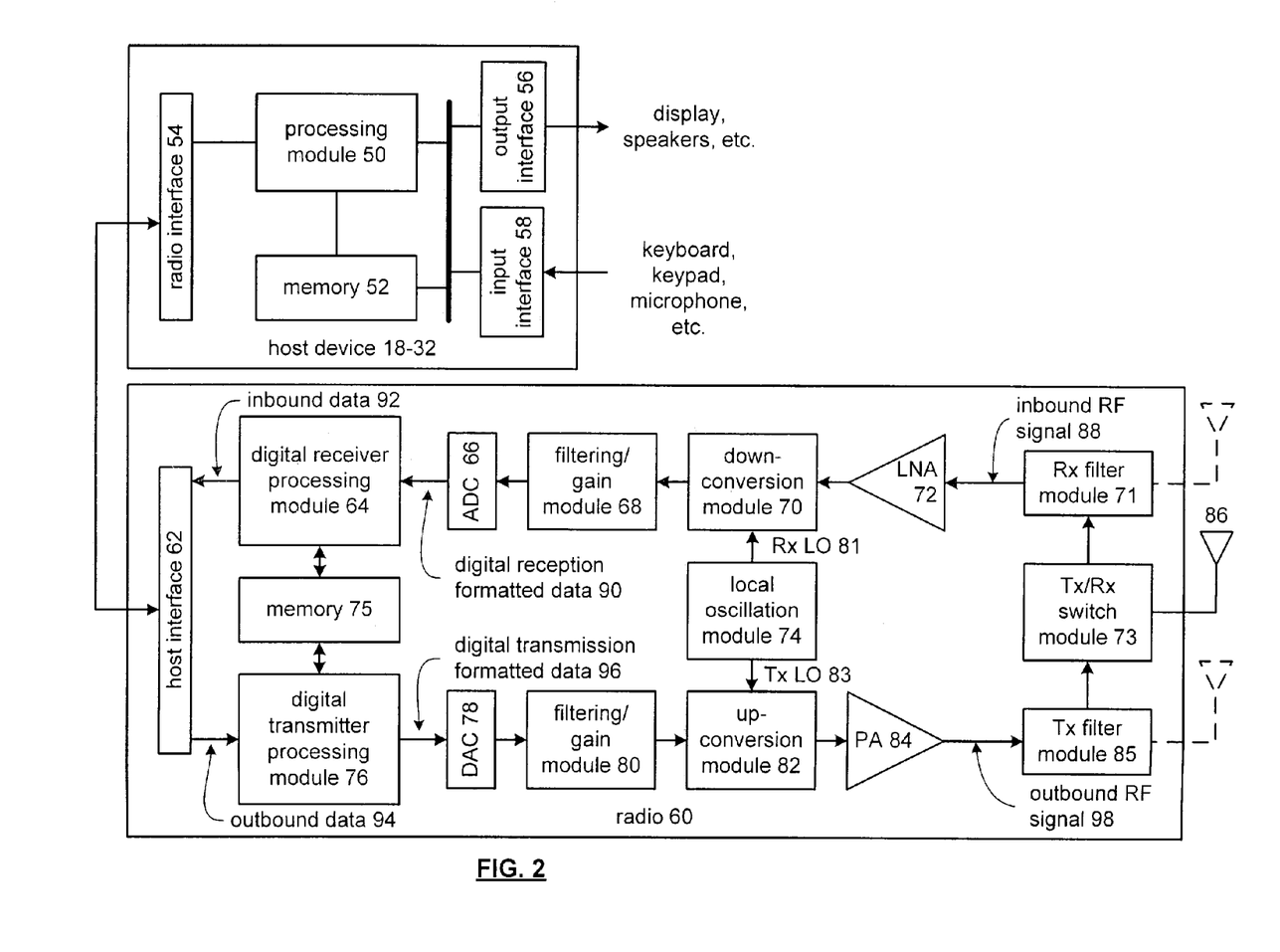
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
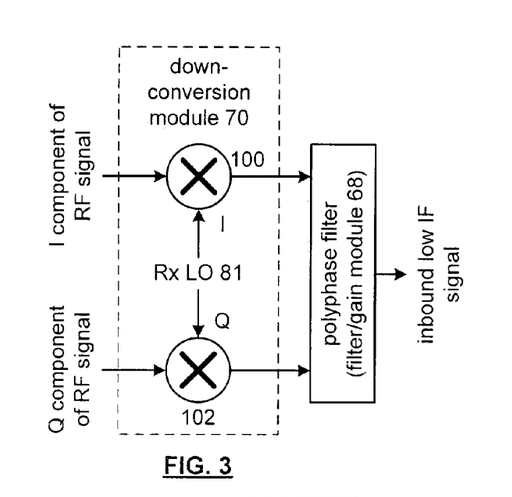
FIG. 3 is a schematic block diagram of a down conversion module and corresponding filter/gain module in accordance with the present invention.

FIG. 3 is a schematic block diagram of down conversion module 70 coupled to filtering/gain module 68. In this embodiment, the down conversion module 70 includes two mixers 100 and 102 and the filter/gain module includes a poly-phase filter. The first mixer 100 is optimally coupled to mix an in-phase component of the inbound RF signal with an in-phase component of the receiver local oscillation 81. The second mixer 102, mixes a quadrature component of the inbound, RF signal with a quadrature component of the receiver local oscillation 81. The mixed signals produced by mixer 100 and mixer 102 are filtered via the filter/gain module 68 to produce an inbound low IF signal. The inbound low IF signal may have an intermediate frequency of zero megahertz to a few megahertz.

Figure 4:
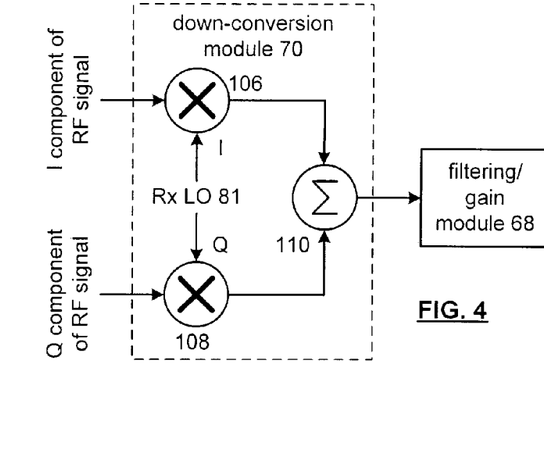
FIG. 4 is a schematic block diagram of a down conversion module and filter/gain module in accordance with the present invention.

FIG. 4 is an alternate schematic block diagram of down conversion module 70 and filter/gain module 68. In this embodiment, the down conversion module 70 includes first and second mixers 106 and 108 and summing module 110. The first mixing module 106 mixes an I component of the inbound RF signal with an in-phase component of the receiver local oscillation 81. The second mixer 108 mixes a quadrature component of the RF signal with a quadrature component of the receiver local oscillation 81. The summing module sums the mixed outputs from the first and second mixer such that the summed value has a frequency corresponding to the difference of the RF signal frequency and the frequency of the local oscillation. The filter/gain module 68 filters the corresponding signal to produce the inbound low IF signal.

Figure 5:
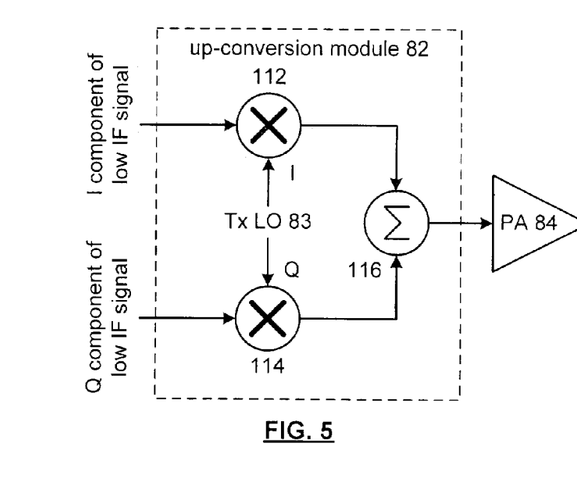
FIG. 5 is a schematic block diagram of an up conversion module in accordance with the present invention.

FIG. 5 is a schematic block diagram of an up conversion module 82 that includes first and second mixers 112 and 14 and a summation module 116. The first mixer 112 mixes an in-phase component of a low IF signal with an in-phase component of the transmit local oscillation 83. The second mixer 114 mixes a quadrature component of a low IF signal with a quadrature component of the transmit local oscillation 83. Summation module 116 sums the outputs of mixer 112 and 114 to produce a signal that includes a component that has a component having a frequency corresponding to the sum of the IF and local oscillation and a component having a frequency corresponding to the difference between the local oscillation and IF frequency. The output of the summation module 116 may be filtered to substantially attenuate, or block, the signal component representing the difference between the local oscillation and intermediate frequencies such that the signal component having the frequency corresponding to the summation of the local oscillation and intermediate frequency passes to the power amplifier 84.

Figure 6:
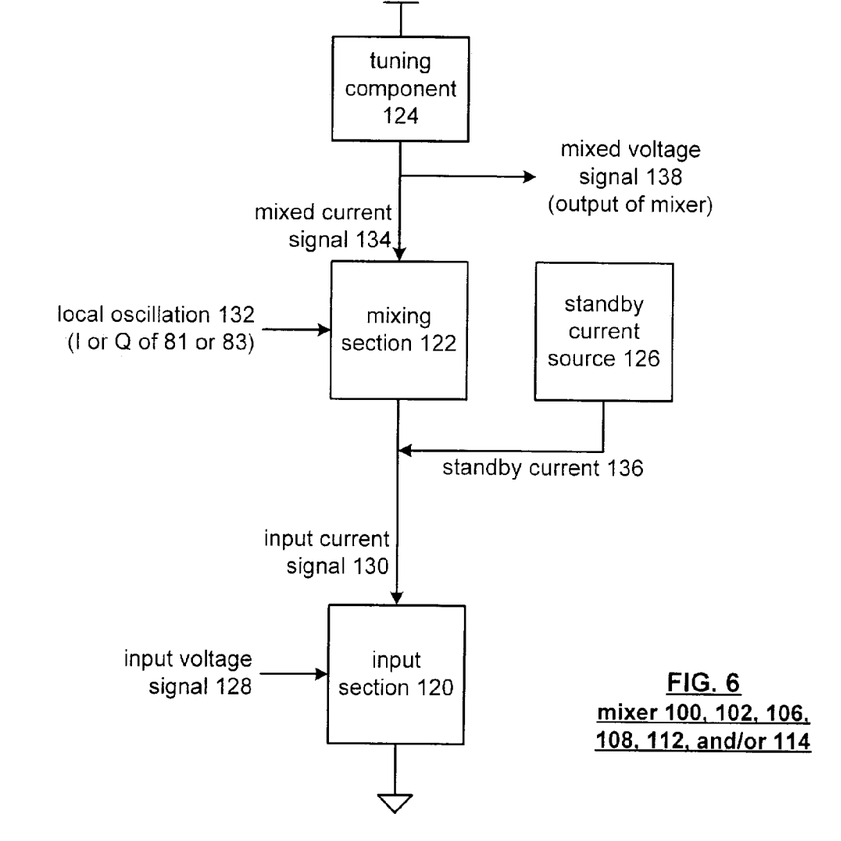
FIG. 6 is a schematic block diagram of a mixer in accordance with the present invention.

FIG. 6 is a schematic block diagram of a high gain, highly linear mixer for mixer 100, 102, 106, 108, 112 and/or 114 as shown in FIGS. 3–5. The mixer includes an input section 120, a mixing section 122, a tuning component 124 and a standby current source 126. The input section 120 is operably coupled to receive an input voltage signal 128 and produce therefrom an input current signal 130 in accordance with the transconductance properties of the input section 120. The input voltage 128 may correspond to the RF signals and/or IF signals illustrated in FIGS. 3–5. In general, the input section converts the input signal into an input current signal in accordance with small scale signaling.

The mixing section 122 mixes the input current signal 130 with a local oscillation 132, which may be the in-phase or quadrature component of the transmit local oscillation 83 or the receive local oscillation 81. To reduce the amount of current of the mixing section 122, the standby current source 126 injects a standby current 136. By reducing the current loading of the mixing section 122 via the standby current 136, the mixer has improved current loading, which improves its gain, and has reduced sensitivity to the local oscillation, which improves its overall linearity.

The mixing section 122 produces the mixed current signal 134 as a result of mixing the local oscillation 132 with input current signal 130. The tuning component 124, which may be an inductor, resistor, etc., converts the mixed current signal 134 into a mixed voltage signal 138, which provides the output of the mixer. The mixing section 122 mixes the local oscillation with the input current in accordance with large scale signaling. As such, current is continuously flowing through the input section 120 due to the small scale signaling and is intermittently flowing through the mixing section 122, or a portion thereof, in accordance with the large scale signaling.

Figure 7:
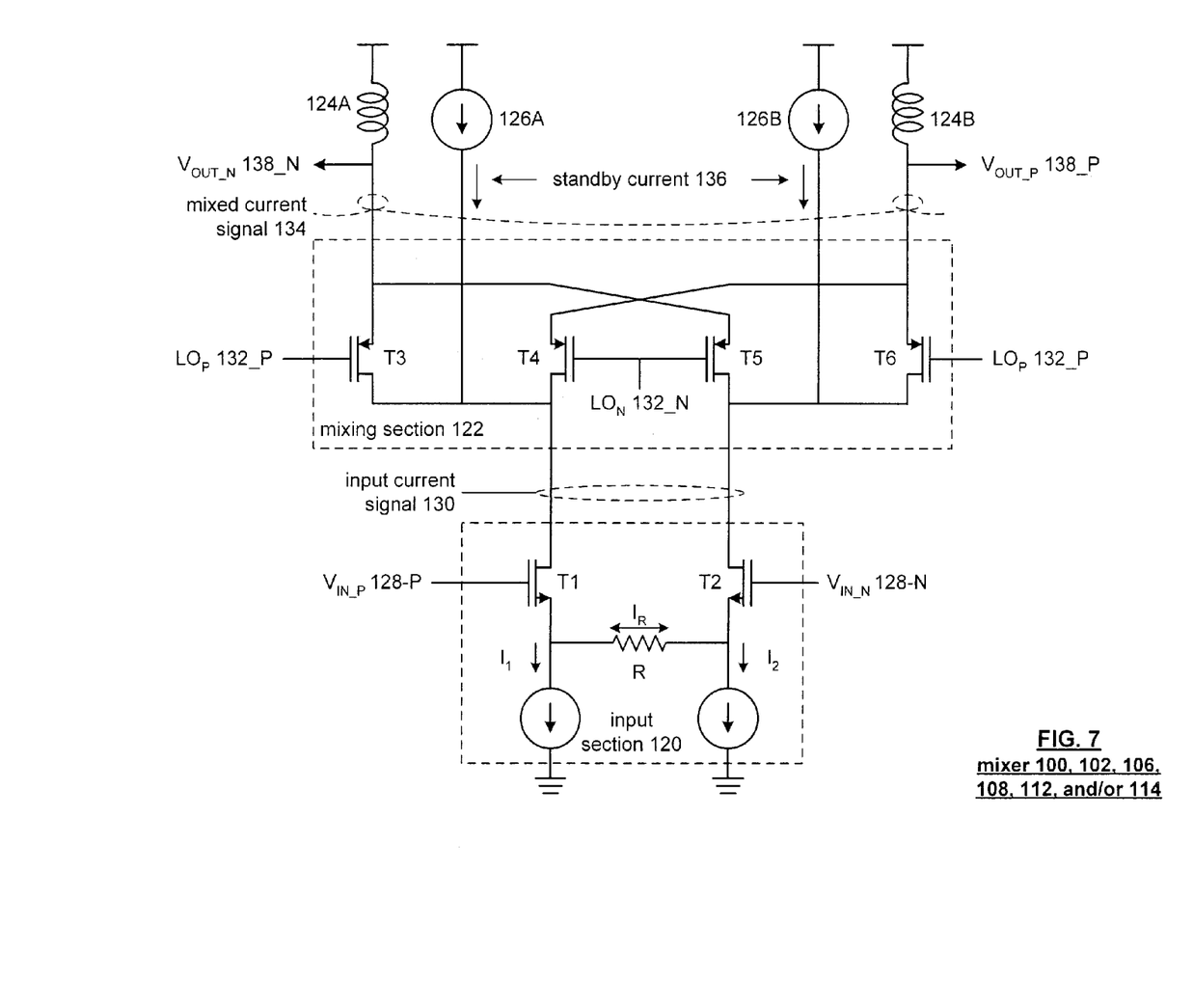
FIG. 7 is a schematic block diagram of a differential signaling mixer in accordance with the present invention.

FIG. 7 is a schematic block diagram of a differential signal mixer that may be used for mixer 100, 102, 106, 108, 112 and/or 114 in FIGS. 3–5. The mixer includes an input section 120, the mixing section 122, the standby current sources 126a 126b and the tuning components 124a and 124b. The input section 120 includes two current sources, a resistor, and two input transistors. The gates of the input transistors are operably coupled to receive the positive phase of the input voltage 128 and the negative phase of the input voltage 128. The resistor is operably coupled between the sources of transistors T1 and T2 and a current ($I_r$) flows through the resistor (R). To enhance the gain of the mixer, the current sources of input section 120 are increased. For example, the current sources may be one-milliamp current sources.

The mixing section 122 includes transistors T3–T6 that are operably coupled to mix the positive and negative phases of the local oscillation with the input current signal 130. To offset the current processed by the mixing section 122, standby current 136 is produced by current sources 126a and 126b. The current produced by standby current source 126a is less than the first current produced by the first current source ($I_1$) minus the current flowing through the resistor. Similarly, the second standby current produced by current source 126b is less than the second current source current ($I_2$) minus the current through resistor ($I_r$). The currents $I_1$ and $I_2$ are established based on the voltage swing of the input voltage, the gain of the first and second transistors and the desired current flowing through the resistor. For example, the input voltage swing on the gates of transistors T1 and T2 may range from 0 to 500 milivolts and the desired current through the resistor is 300 microamps. Accordingly, the first and second currents $I_1$ and $I_2$ may be one milliamp where the standby currents produced by current sources 126a and 126b will be less than 700 microamps.

The transistors T3–T6 of mixing section 122 produce the mixed current signal 134 by mixing the local oscillation. 132 with the input current signal 130. Since a substantial portion of the input current signal 130 is offset by the standby current 136, transistors T3–T6 produce less current thus require less gate source voltage swing to achieve the necessary current. Accordingly, with transistors T3–T6 requiring less input voltage (i.e., the gate source voltage that is provided the local oscillation) their sensitivity to the local oscillation is reduced, which improves the linearity of the overall mixer.

The tuning components 124a and 124b produce the corresponding differential output 138. As one of average skill in the art will appreciate, the transistors T1 and T2 may be P-channel transistors and transistors T3–T6 may be N-channel transistors with the mixer circuit inverted to compensate for the different types of transistors.

Figure 8:
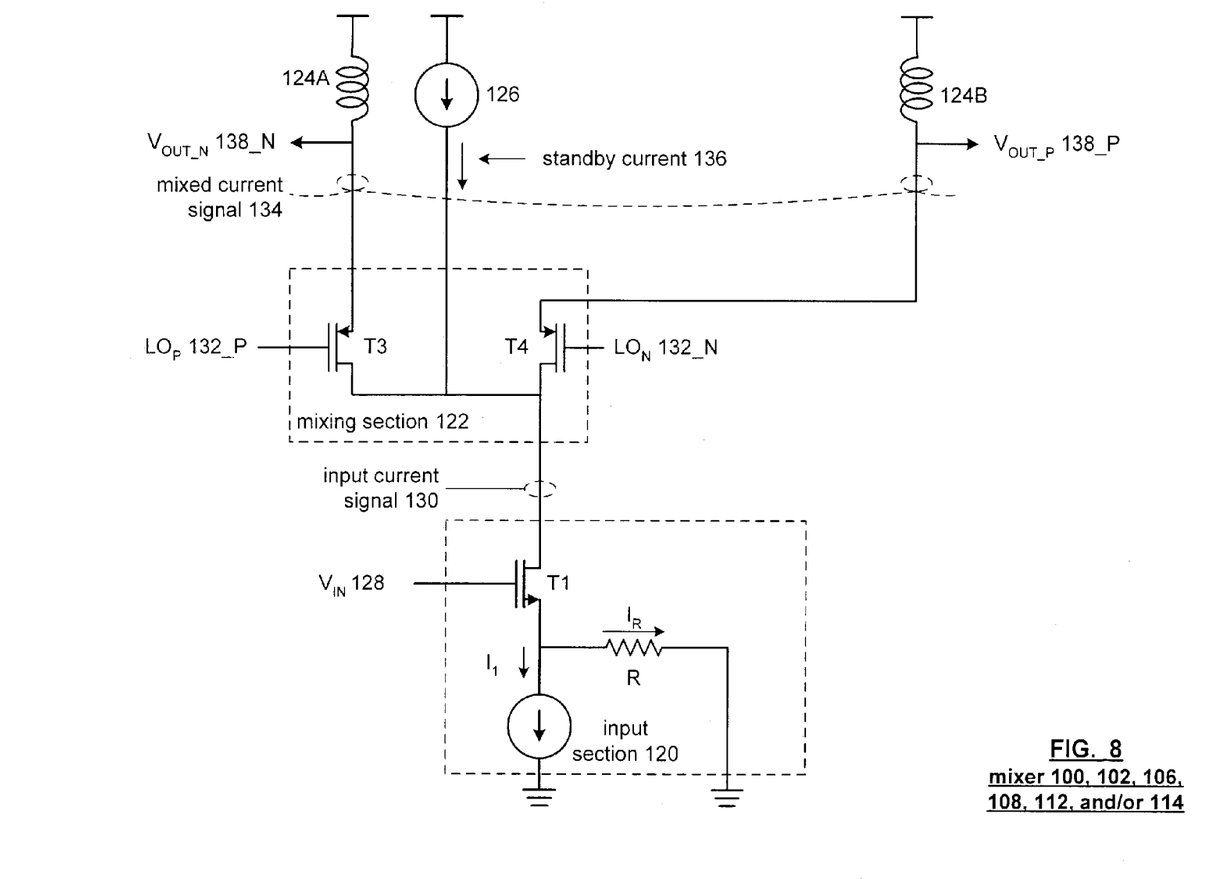
FIG. 8 is a schematic block diagram of a single ended mixer in accordance with the present invention.

FIG. 8 is a schematic block diagram of a single ended mixer that may be used for mixer 100, 102, 106, 108, 112 and/or 114. The mixer includes the input section 120, the mixing section 122, a single standby current source 126 and tuning components 124a and 124b, which are inductors. The input section 120 includes a transistor T1, a current source that produces a current $I_1$ and a resistor that sinks current $I_r$. The transistor T1 is biased to operate in a small signal mode such that an input current 130 is continually flowing and representative of the input voltage 128.

The mixing section 122 mixes the input current signal 130, which is representative of the single ended input signal 128, with the local oscillation 132. The standby current 136 offsets the amount of current required by T3 and T4 thereby desensitizing the mixing section 122 to imperfections in the local oscillation thereby improving the linearity of the overall mixer. The tuning components 124a and 124b convert the mixed current signal 134 into a differential voltage output 138.

The preceding discussion has presented various embodiments for a high gain, highly linear mixer by increasing the current within the input section of the mixer, the gain is increased and by including the standby current, the mixing section is less sensitive to imperfections in the local oscillation thereby yielding a high gain, highly linear mixer. As one of average skill in the art will appreciate, other embodiments may be derived from the teaching of the present invention without deviating from the scope of the claims.

What is claimed is:

1. A high gain, highly linear mixer comprises:
    an input section operably coupled to receive an input voltage signal, wherein the input section provides a linear transconductance of the input voltage signal to produce an input current signal, the input section further includes:
        first transistor having a gate, a drain, and a source, wherein the gate of the first transistor is operably coupled to receive a positive leg of the input voltage signal;
        second transistor having a gate, a drain, and a source, wherein the gate of the second transistor is operably coupled to receive a negative leg of the input voltage signal;
        first current source for sinking a first current, wherein the first current source is coupled to the source of the first transistor;
        second current source for sinking a second current, wherein the second current source is coupled to the source of the second transistor; and
        resistor operably coupled to the sources of the first and second transistors, wherein the resistor establishes an output reference voltage for the high gain, highly linear mixer;
    mixing section operably coupled to the drains of the first and second transistors to mix a local oscillation with the input current signal to produce a mixed current signal;
    at least one tuning component operably coupled to the mixing section, wherein the at least one tuning component converts the mixed current signal into a mixed voltage signal; and
    at least one standby current source operably coupled to the mixing section, wherein the at least one standby current source provides a standby current to the mixing section such that switching current of the mixing section is reduced thereby improving gain of the high gain, highly linear mixer.

2. The high gain, highly linear mixer of claim 1 wherein:
the first current source to provide the first current based on voltage swing of the input voltage signal, gain of the first transistor, and current flow through the resistor; and
the second current source to provide the second current based on the voltage swing of the input voltage signal, gain of the second transistor, and the current flow through the resistor.

3. The high gain, highly linear mixer of claim 2, wherein the at least one standby current source further includes:
a first standby current source to provide a first standby current of the standby current that is less than the first current minus current flowing through the resistor; and
a second standby current source to provide a second standby current of the standby current that is less than the second current minus the current flowing through the resistor.

4. The high gain, highly linear mixer of claim 1, wherein the mixing section further includes:
third transistor having a gate, a drain, and a source, wherein the gate of the third transistor is operably coupled to receive a positive leg of the local oscillation and the source of the third transistor is coupled to a first tuning component of the at least one tuning component;
fourth transistor having a gate, a drain, and a source, wherein the gate of the fourth transistor is operably coupled to receive a negative leg of the local oscillation and the source of the fourth transistor is coupled to a second tuning component of the at least one tuning component;
fifth transistor having a gate, a drain, and a source, wherein the gate of the fifth transistor is operably coupled to receive the negative leg of the local oscillation and the source of the fifth transistor is coupled to the first tuning component of the at least one tuning component; and
sixth transistor having a gate, a drain, and a source, wherein the gate of the sixth transistor is operably coupled to receive the positive leg of the local oscillation and the source of the sixth transistor is coupled to the second tuning component of the at least one tuning component, wherein the drains of the third and sixth transistors provide a differential output of the high gain, highly linear mixer.

5. The high gain, highly linear mixer of claim 1 wherein:
the input section converts the input voltage signal into the input current signal in accordance with small scale signal processing; and
the mixing section mixes the local oscillation with the input current signal in accordance large scale signal processing.

6. A radio frequency (RF) transmitter comprises:
in-phase mixer operably coupled to mix an in-phase component of a low intermediate frequency (IF) signal with an in-phase component of a local oscillation to produce an in-phase mixed RF component;
quadrature mixer operably coupled to mix a quadrature component of the low IF signal with a quadrature component of the local oscillation to produce a quadrature mixed RF component;
summing module operably coupled to sum the in-phase mixed RF component with the quadrature mixed component to produce a RF signal; and
power amplifier operably coupled to amplify the RF signal to produce an outbound RF signal, wherein each of the in-phase mixer and quadrature mixer includes:
an input section operably coupled to receive the in-phase component or quadrature component of the low IF signal, wherein the input section provides a linear transconductance of the in-phase component or quadrature component of the low IF signal to produce an input current signal, the input section further includes:
first transistor having a gate, a drain, and a source, wherein the gate of the first transistor is operably coupled to receive a positive leg of the in-phase component or quadrature component of the low IF signal;
second transistor having a gate, a drain, and a source, wherein the gate of the second transistor is operably coupled to receive a negative leg of the in-phase component or quadrature component of the low IF signal;
first current source for sinking a first current, wherein the first current source is coupled to the source of the first transistor;
second current source for sinking a second current, wherein the second current source is coupled to the source of the second transistor; and
resistor operably coupled to the sources of the first and second transistors, wherein the resistor establishes an output reference voltage for the in-phase mixer or the quadrature mixer;
mixing section operably coupled to the drains of the first and second transistors to mix the in-phase component or the quadrature component of the local oscillation with the input current signal to produce a mixed current signal;
at least one tuning component operably coupled to the mixing section, wherein the at least one tuning component converts the mixed current signal into the in-phase mixed RF component or the quadrature mixed RF component; and
at least one standby current source operably coupled to the mixing section, wherein the at least one standby current source provides a standby current to the mixing section such that switching current of the mixing section is reduced thereby improving gain of the in-phase mixer or the quadrature mixer.

7. The RF transmitter of claim 6 wherein:
the first current source to provide the first current based on voltage swing of the in-phase component or quadrature component of the low IF signal, gain of the first transistor, and current flow through the resistor; and
the second current source to provide the second current based on the voltage swing of the in-phase component or quadrature component of the low IF signal, gain of the second transistor, and the current flow through the resistor.

8. The RF transmitter of claim 7, wherein the at least one standby current source further includes:
a first standby current source to provide a first standby current of the standby current that is less than the first current minus current flowing through the resistor; and
a second standby current source to provide a second standby current of the standby current that is less than the second current minus the current flowing through the resistor.

9. The RF transmitter of claim 6, wherein the mixing section further includes:
third transistor having a gate, a drain, and a source, wherein the gate of the third transistor is operably coupled to receive a positive leg of the in-phase component or quadrature component of the local oscillation and the source of the third transistor is coupled to a first tuning component of the at least one tuning component;

fourth transistor having a gate, a drain, and a source, wherein the gate of the fourth transistor is operably coupled to receive a negative leg of the in-phase component or quadrature component of the local oscillation and the source of the fourth transistor is coupled to a second tuning component of the at least one tuning component;

fifth transistor having a gate, a drain, and a source, wherein the gate of the fifth transistor is operably coupled to receive the negative leg of the in-phase component or quadrature component of the local oscillation and the source of the fifth transistor is coupled to the first tuning component of the at least one tuning component; and sixth transistor having a gate, a drain, and a source, wherein the gate of the sixth transistor is operably coupled to receive the positive leg of the in-phase component or quadrature component of the local oscillation and the source of the sixth transistor is coupled to the second tuning component of the at least one tuning component, wherein the drains of the third and sixth transistors provide a differential output of the in-phase mixer or the quadrature mixer.

10. The RF transmitter of claim 6 wherein:

the input section converts the in-phase component or quadrature component of the low IF signal into the input current signal in accordance with small scale signal processing; and the mixing section mixes the in-phase component or quadrature component of the local oscillation with the input current signal in accordance large scale signal processing.

11. A high gain, highly linear mixer comprises:

an input section operably coupled to receive an input voltage signal, wherein the input section provides a linear transconductance of the input voltage signal to produce an input current signal;

mixing section operably coupled to mix a local oscillation with the input current signal to produce a mixed current signal, wherein the mixing section further includes:

first transistor having a gate, a drain, and a source, wherein the gate of the first transistor is operably coupled to receive a positive leg of the local oscillation and the source of the first transistor is coupled to a first tuning component;

second transistor having a gate, a drain, and a source, wherein the gate of the second transistor is operably coupled to receive a negative leg of the local oscillation and the source of the second transistor is coupled to a second tuning component, wherein the drains of the first and second transistors provide an output of the high gain, highly linear mixer when the tuning components convert the mixed current signal into a mixed voltage signal; and at least one standby current source operably coupled to the mixing section, wherein the at least one standby current source provides a standby current to the mixing section such that switching current of the mixing section is reduced thereby improving gain of the high, gain, highly linear mixer.

12. The high gain, highly linear mixer of claim 11, wherein the input section further includes:

third transistor having a gate, a drain, and a source, wherein the gate of the third transistor is operably coupled to receive the input voltage signal, wherein the drain of the third transistor is coupled to the mixing section;

first current source for sinking a first current, wherein the first current source is coupled to the source of the third transistor; and resistor operably coupled to the source of the third transistor, wherein the resistor establishes an output reference voltage for the high gain highly linear mixer.

13. The high gain, highly linear mixer of claim 11, wherein the input section further includes:

third transistor having a gate, a drain, and a source, wherein the gate of the third transistor is operably coupled to receive a positive leg of the input voltage signal;

fourth transistor having a gate, a drain, and a source, wherein the gate of the fourth transistor is operably coupled to receive a negative leg of the input voltage signal;

first current source for sinking a first current, wherein the first current source is coupled to the source of the third transistor;

second current source for sinking a second current, wherein the second current source is coupled to the source of the fourth transistor; and resistor operably coupled to the sources of the third and fourth transistors, wherein the resistor establishes an output reference voltage for the high gain, highly linear mixer.

* * * * *